(12) United States Patent
Tetelbaum

(10) Patent No.: US 7,039,891 B2
(45) Date of Patent: May 2, 2006

(54) METHOD OF CLOCK DRIVEN CELL PLACEMENT AND CLOCK TREE SYNTHESIS FOR INTEGRATED CIRCUIT DESIGN

(75) Inventor: Alexander Tetelbaum, Hayward, CA (US)

(73) Assignee: LSI Logic Corporation, Milpitas, CA (US)

( * ) Notice: Subject to any disclaimer, the term of this patent is extended or adjusted under 35 U.S.C. 154(b) by 141 days.

(21) Appl. No.: 10/650,296

(22) Filed: Aug. 27, 2003

(65) Prior Publication Data

US 2005/0050497 A1    Mar. 3, 2005

(51) Int. Cl.
    *G06F 17/50* (2006.01)
(52) U.S. Cl. .................. 716/13; 716/5; 716/7; 716/10; 716/11
(58) Field of Classification Search ................ 716/5–14
    See application file for complete search history.

(56) References Cited

U.S. PATENT DOCUMENTS

| 4,939,389 A | 7/1990 | Cox et al. | |
| 6,305,001 B1 * | 10/2001 | Graef | 716/12 |
| 6,442,739 B1 | 8/2002 | Palermo et al. | |
| 6,487,697 B1 * | 11/2002 | Lu et al. | 716/2 |
| 6,543,041 B1 | 4/2003 | Scheffer et al. | |
| 6,550,044 B1 * | 4/2003 | Pavisic et al. | 716/6 |
| 6,550,045 B1 * | 4/2003 | Lu et al. | 716/6 |
| 6,556,022 B1 | 4/2003 | To et al. | |
| 6,810,505 B1 * | 10/2004 | Tetelbaum et al. | 716/1 |
| 2003/0051222 A1 * | 3/2003 | Williams et al. | 716/12 |
| 2005/0010884 A1 * | 1/2005 | Lu et al. | 716/6 |

* cited by examiner

*Primary Examiner*—Vuthe Siek
(74) *Attorney, Agent, or Firm*—Fitch, Even, Tabin & Flannery

(57) ABSTRACT

A method of cell placement and clock tree synthesis includes steps of: (a) identifying critical paths in an integrated circuit design; (b) partitioning the integrated circuit design into a timing group for each of the critical paths; (c) assigning each flip-flop in a critical path to a timing group corresponding to the critical path; (d) performing a cell placement to minimize a function of propagation delay and maximum distance between flip-flops within each timing group; and (e) constructing a clock sub-net for each timing group.

18 Claims, 9 Drawing Sheets

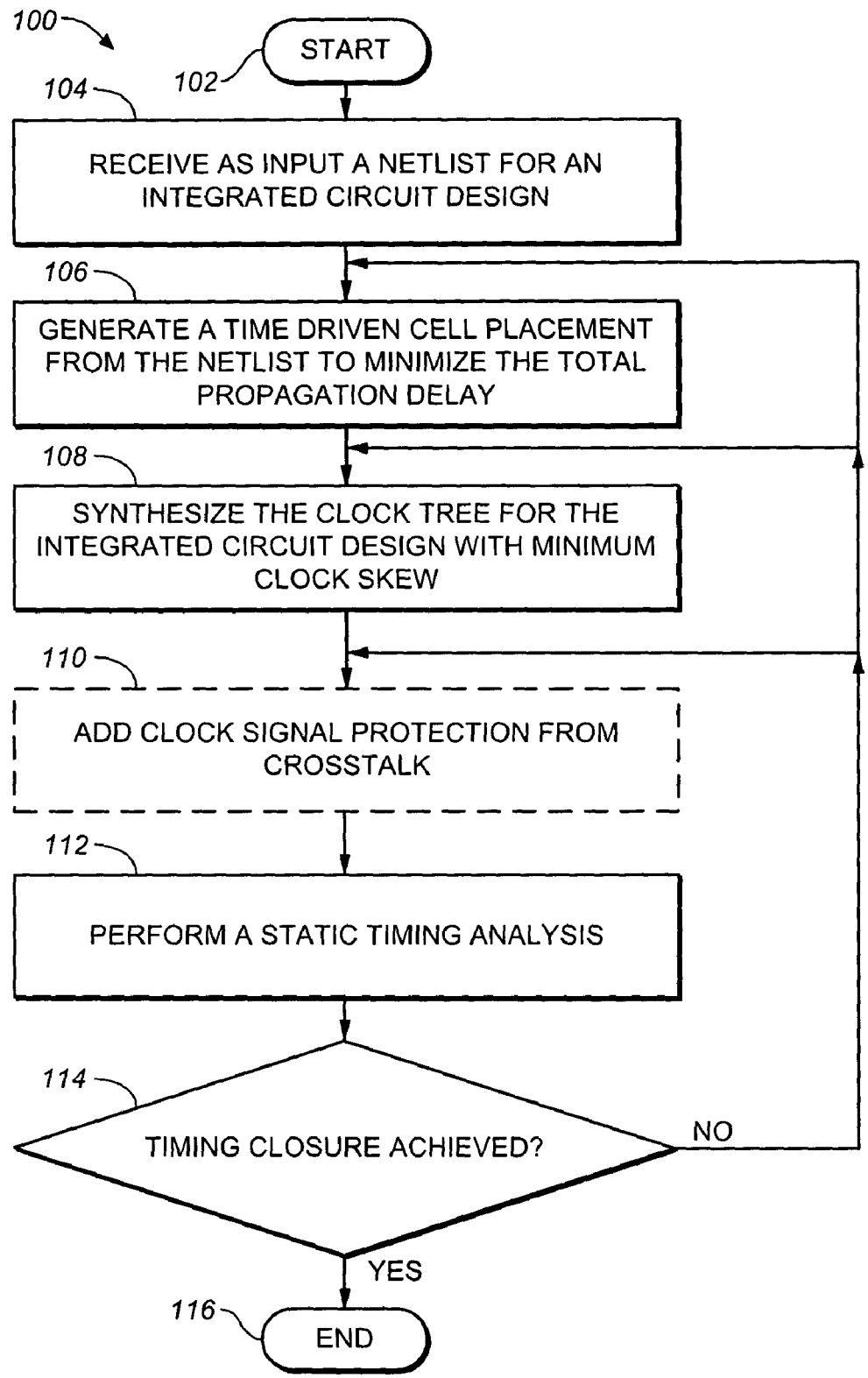
FIG._1
*(PRIOR ART)*

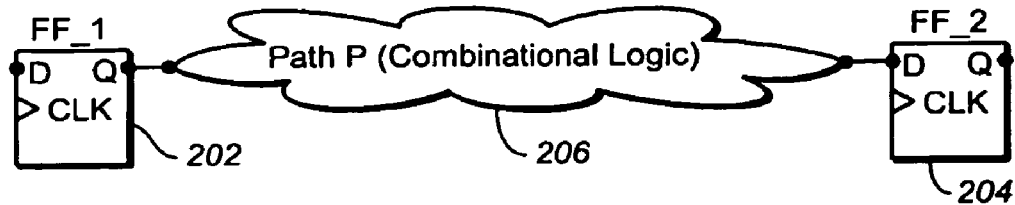
FIG._2
*(PRIOR ART)*
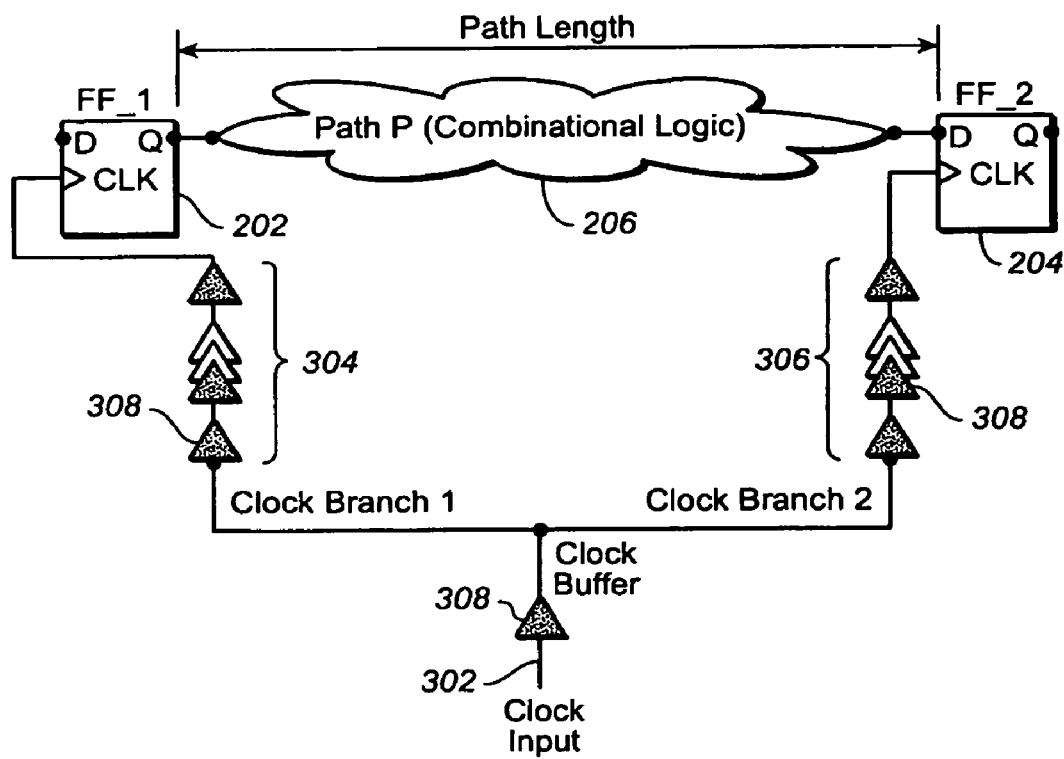
FIG._3
*(PRIOR ART)*

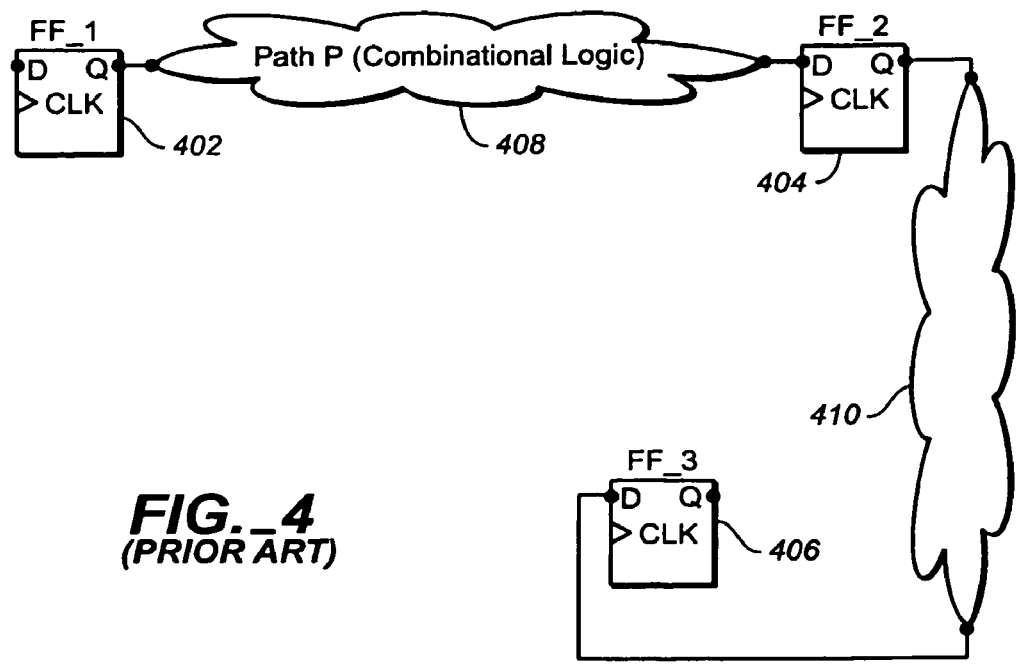
FIG._4
*(PRIOR ART)*
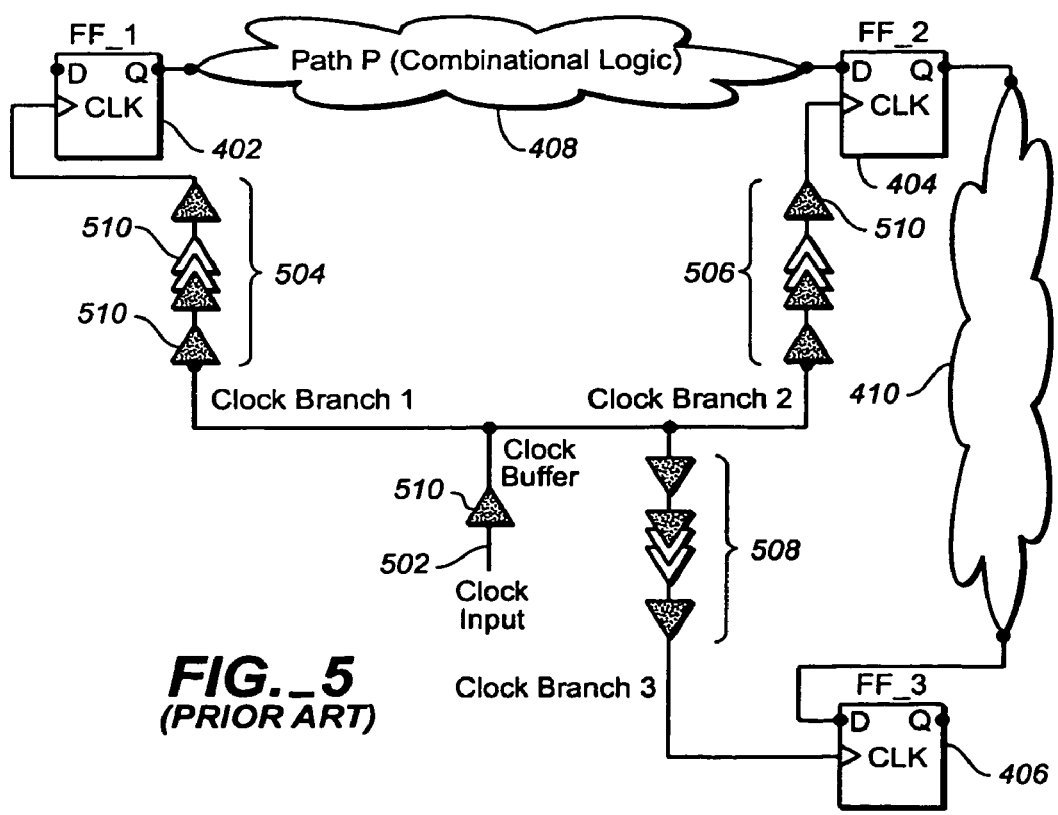
FIG._5
*(PRIOR ART)*

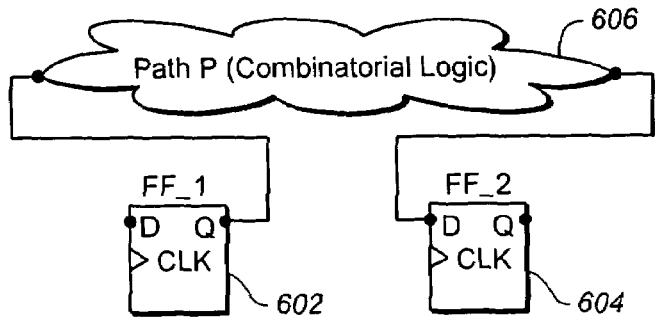
FIG._6
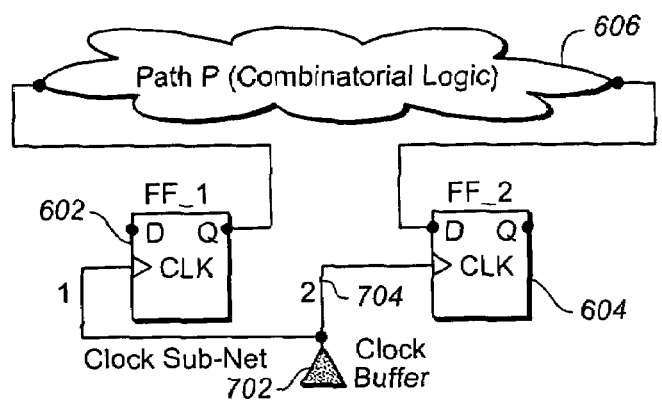
FIG._7
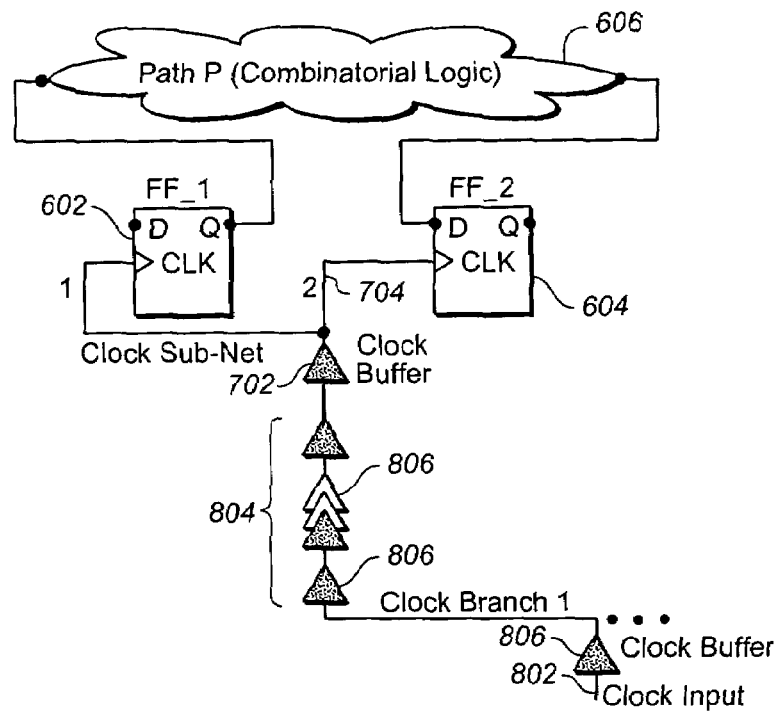
FIG._8

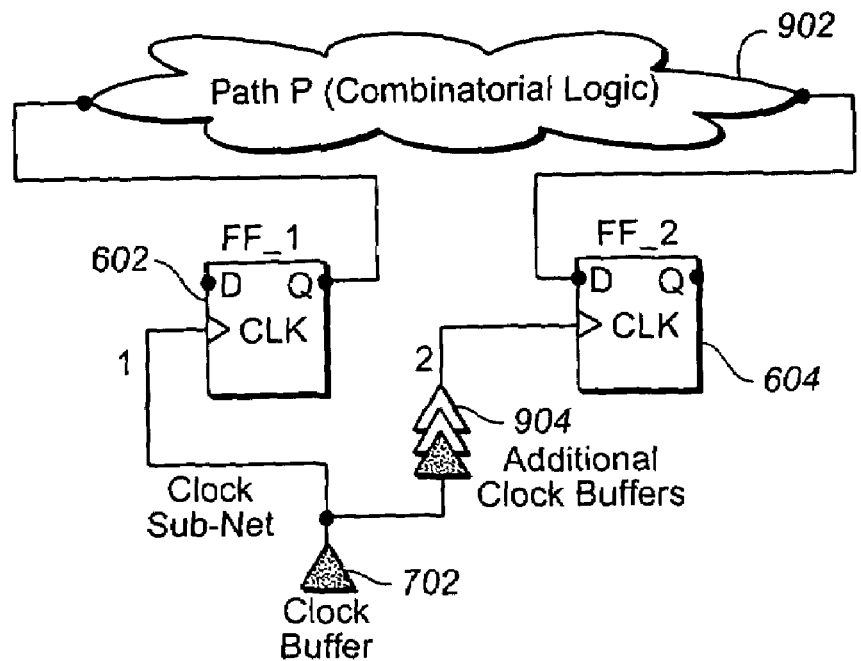
FIG._9
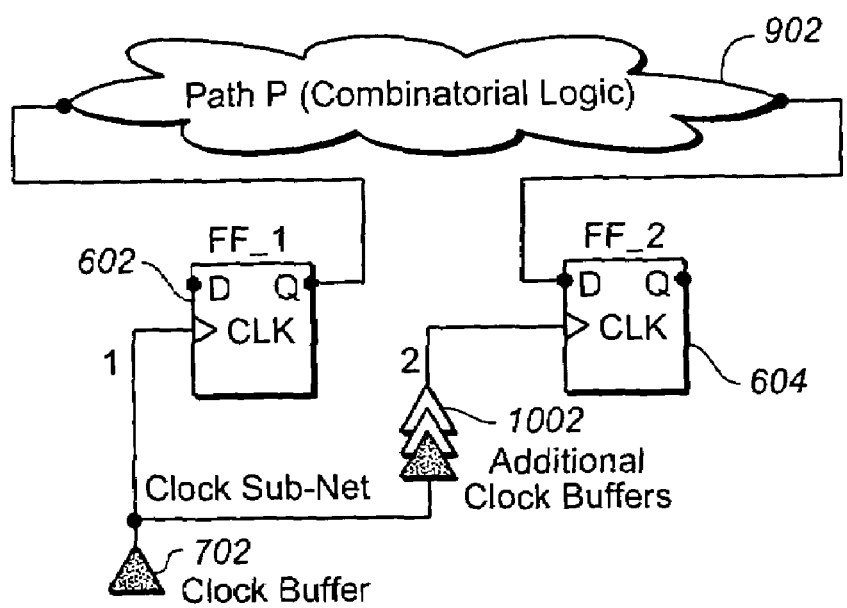
FIG._10

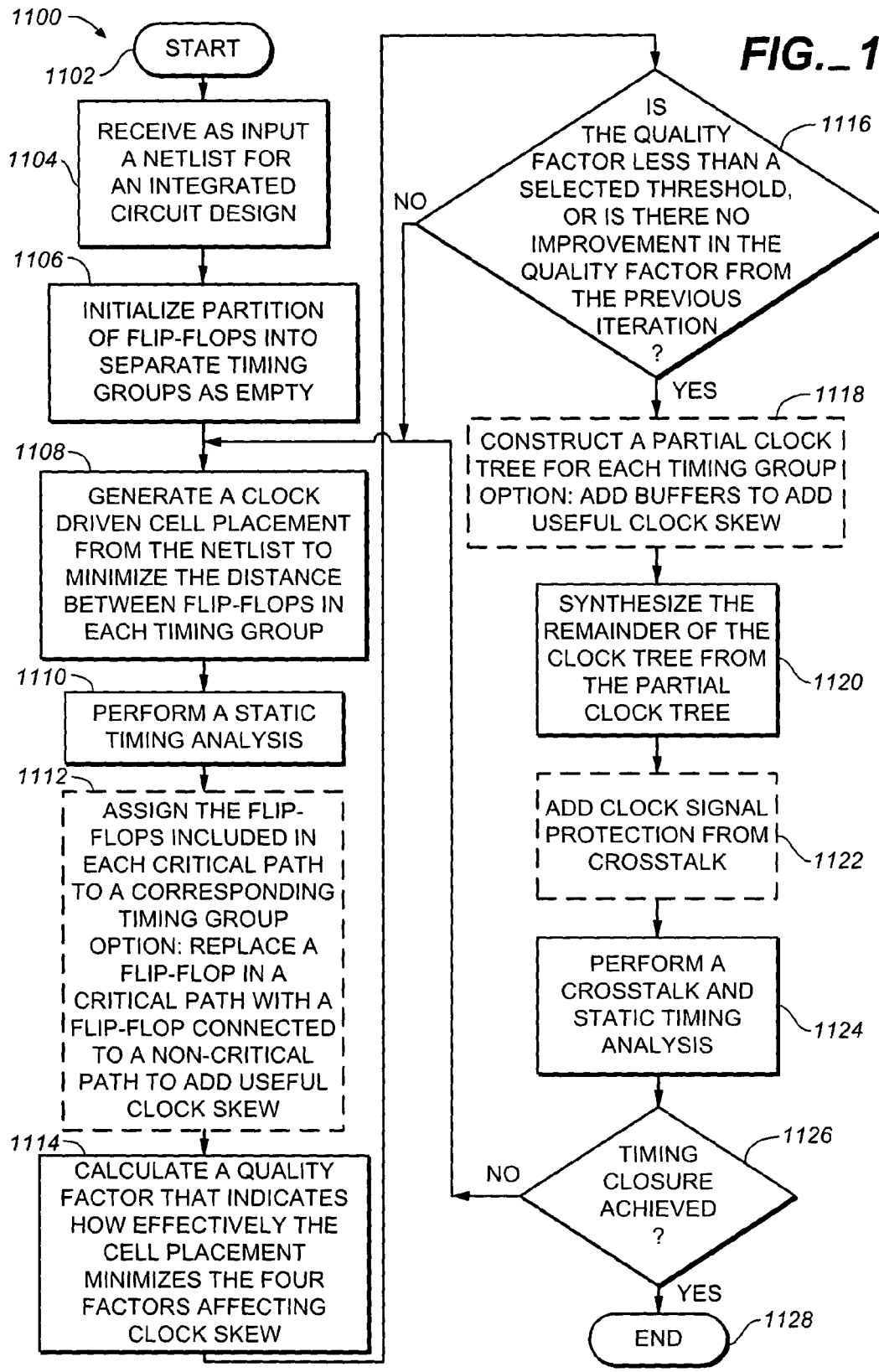
FIG._11

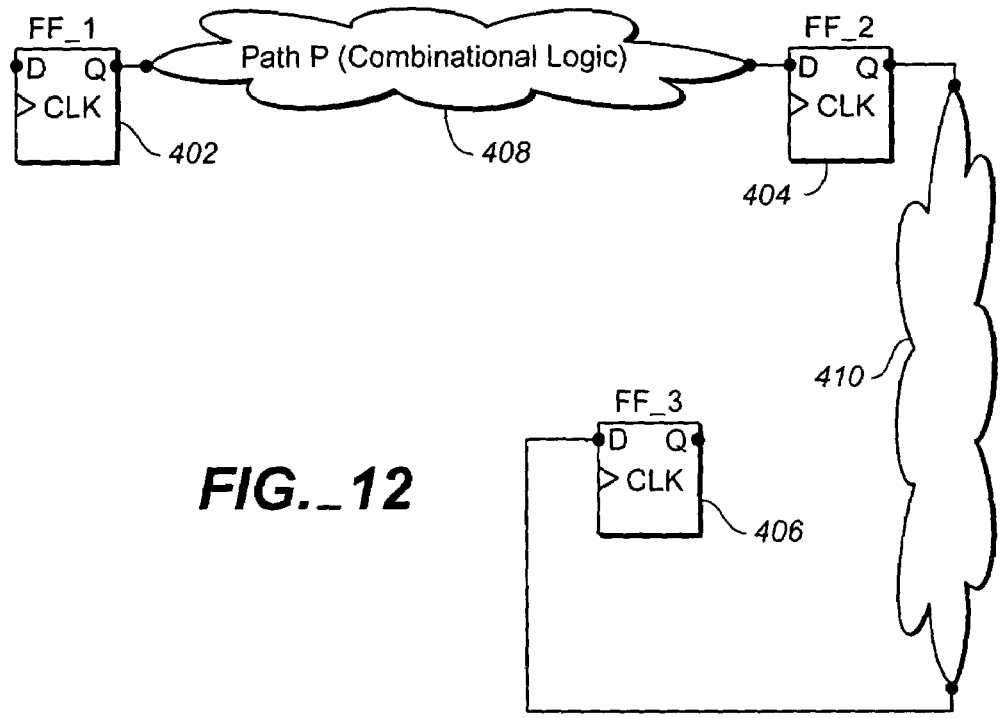
FIG._12
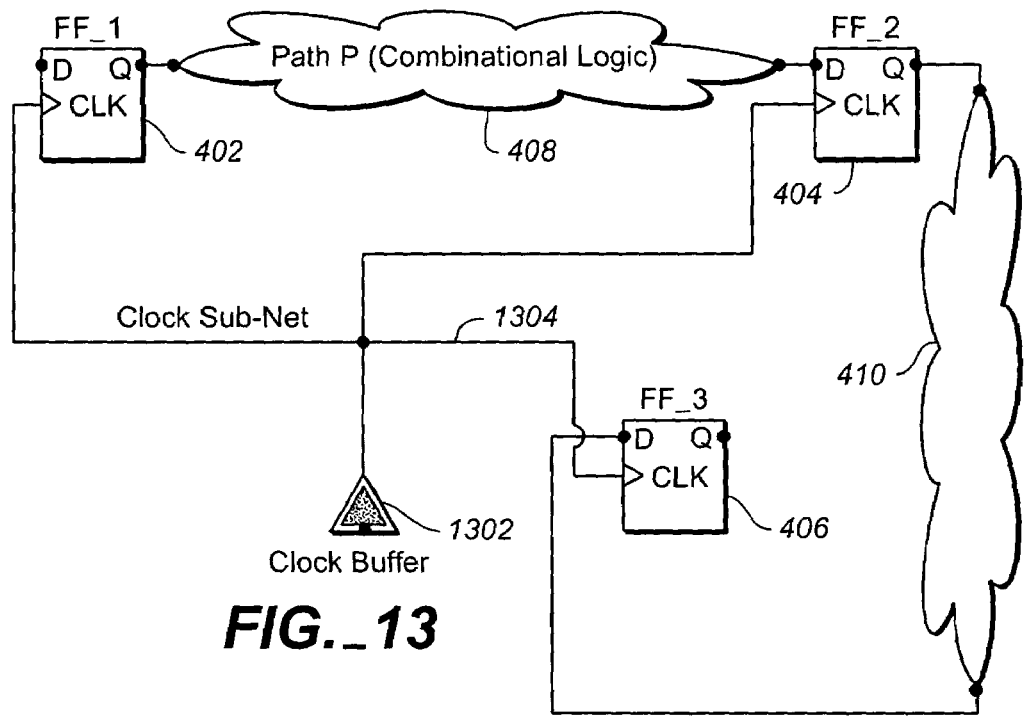
FIG._13

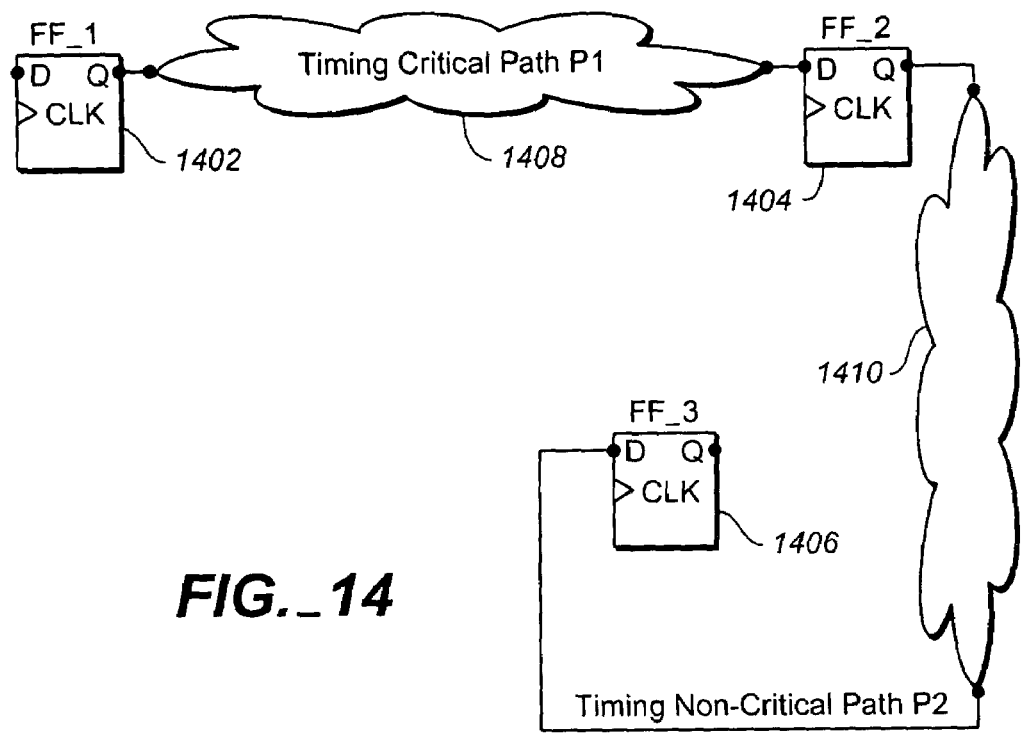
FIG._14
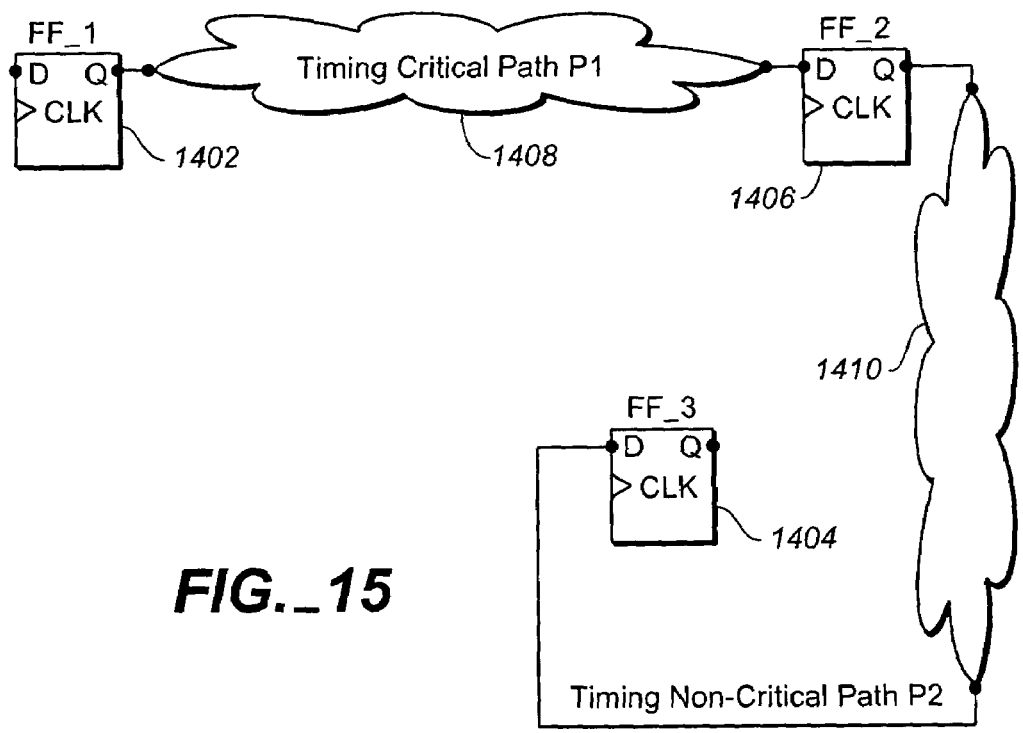
FIG._15

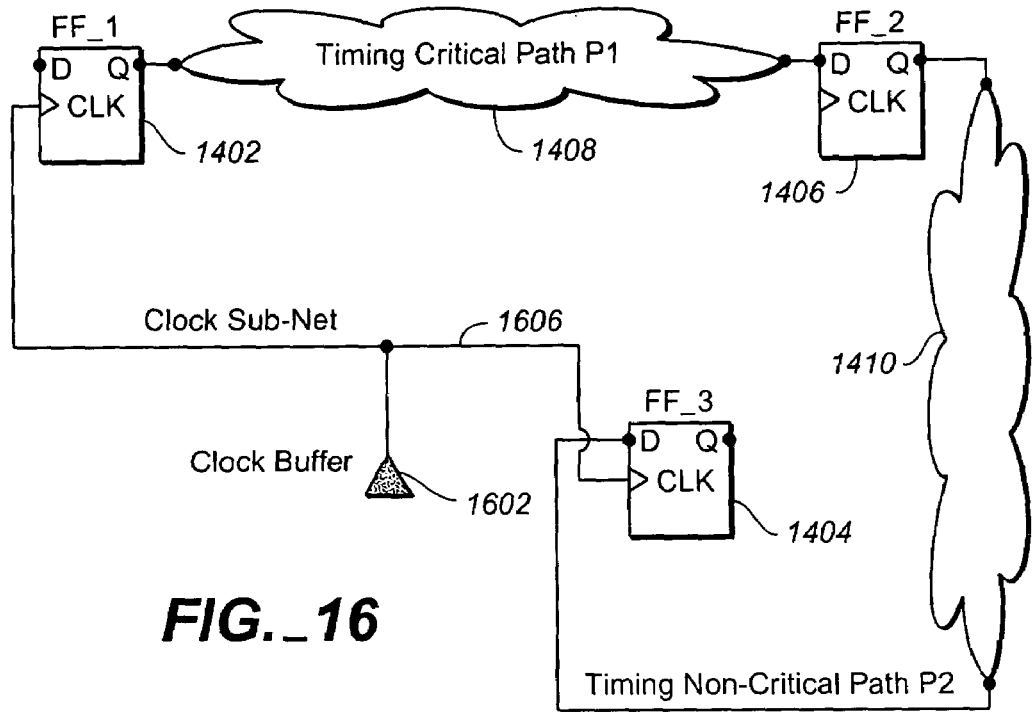
FIG._16
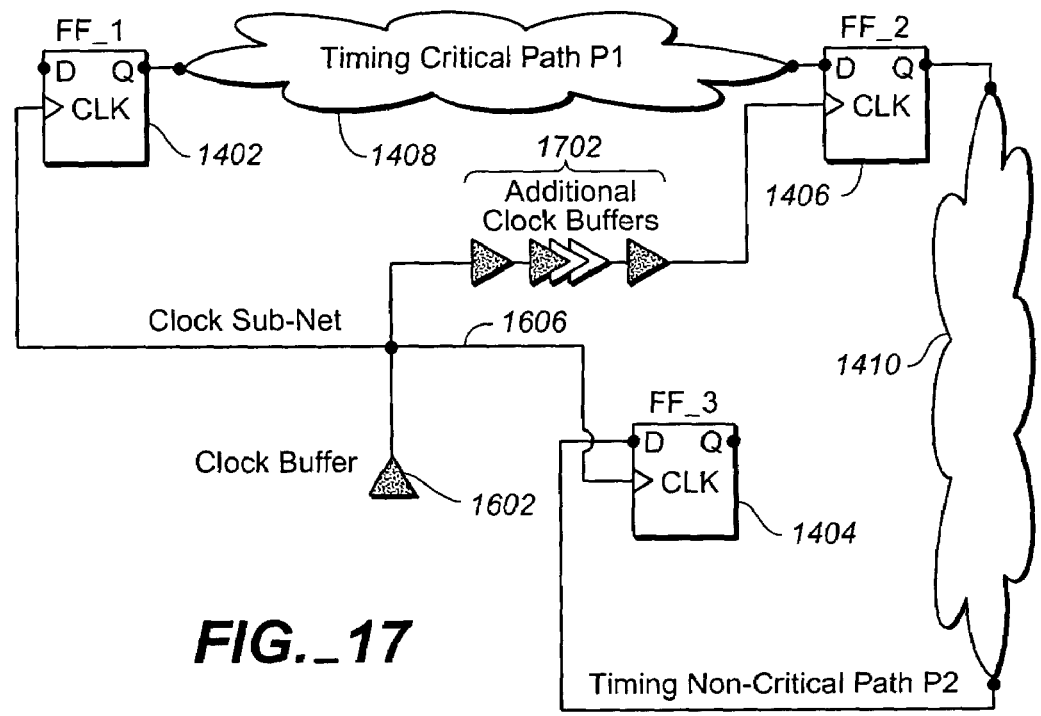
FIG._17

METHOD OF CLOCK DRIVEN CELL PLACEMENT AND CLOCK TREE SYNTHESIS FOR INTEGRATED CIRCUIT DESIGN

BACKGROUND OF THE INVENTION

1. Field of the Invention

The present invention relates generally to the design and manufacture of integrated circuits. More specifically, but without limitation thereto, the present invention relates to methods of distributing a common clock signal for an integrated circuit design within timing constraints that are determined by the selection and arrangement of clocked logic elements in the circuit design.

2. Description of Related Art

Clock signals are widely used in integrated circuit designs to coordinate generation and propagation of logic functions across an integrated circuit die. The distribution of a clock signal to various locations across the integrated circuit die is an important aspect of the circuit design. The difference in the arrival time of a common clock signal at various locations in the physical layout of an integrated circuit design, or floorplan, is called clock skew. The variation in the clock period at various locations in the floorplan is called jitter. Both clock skew and clock jitter may result in decreased performance capability in terms of maximum operating frequency and in circuit malfunction from setup and hold time violations. Previous methods of distributing a common clock signal for an integrated circuit design typically avoid clock skew by a balanced clock tree design and avoid clock jitter by shielding clock signal wires from crosstalk.

SUMMARY OF THE INVENTION

In one aspect of the present invention, a method of cell placement and clock tree synthesis includes steps of: (a) identifying critical paths in an integrated circuit design; (b) partitioning the integrated circuit design into a timing group for each of the critical paths; (c) assigning each flip-flop in a critical path to a timing group corresponding to the critical path; (d) performing a cell placement to minimize a function of propagation delay and maximum distance between flip-flops within each timing group; and (e) constructing a clock sub-net for each timing group.

In another aspect of the present invention, a computer program product for cell placement and clock tree synthesis includes:

a medium for embodying a computer program for input to a computer; and
a computer program embodied in the medium for causing the computer to perform steps of:
(a) identifying critical paths in an integrated circuit design;
(b) partitioning the integrated circuit design into a timing group for each of the critical paths;
(c) assigning each flip-flop in a critical path to a timing group corresponding to the critical path;
(d) performing a cell placement to minimize a function of propagation delay and maximum distance between flip-flops within each timing group; and
(e) constructing a clock sub-net for each timing group.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates a flow chart of a design flow of the prior art for an integrated circuit design;

FIG. 2 illustrates a cell placement of two flip-flops connected by a logic cloud according to the prior art;

FIG. 3 illustrates a clock tree synthesized for the circuit diagram of FIG. 2;

FIG. 4 illustrates an example of multiple logic clouds connected by flip-flops according to the prior art;

FIG. 5 illustrates a clock tree synthesized for the circuit diagram of FIG. 4;

FIG. 6 illustrates a cell placement of two flip-flops connected by a logic cloud according to an embodiment of the present invention;

FIG. 7 illustrates a partial clock tree for the cell placement of FIG. 6;

FIG. 8 illustrates a clock tree synthesis for the cell placement of FIGS. 6 and 7;

FIG. 9 illustrates a partial clock tree for the cell placement of FIG. 6 with inserted clock skew;

FIG. 10 illustrates an alternative partial clock tree for the cell placement of FIG. 6 with inserted clock skew;

FIG. 11 illustrates a flow chart of a method of clock driven placement and clock synthesis according to an embodiment of the present invention;

FIG. 12 illustrates an example of a clock driven cell placement for a timing group according to an embodiment of the present invention;

FIG. 13 illustrates a partial clock tree for the clock driven cell placement of FIG. 12;

FIG. 14 illustrates a timing group that includes a critical timing path connected to a non-critical timing path according to an embodiment of the present invention;

FIG. 15 illustrates an optimum clock driven cell placement for the timing group of FIG. 14;

FIG. 16 illustrates a partial clock tree for the clock driven cell placement of FIG. 15; and FIG. 17 illustrates the addition of a useful clock skew to the partial clock tree of FIG. 16.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

A disadvantage of previous methods of distributing a clock signal in an integrated circuit design is that they do not take into account the timing constraints in the data paths between flip-flops that are clocked by a common clock signal. Timing violations that result from the clock distribution design require an iterative process of redesign and optimization of the clock distribution network, which may significantly increase the design time and cost of the integrated circuit design.

FIG. 1 illustrates a flow chart of a design flow of the prior art for an integrated circuit design.

Step 102 is the entry point of the flow chart 100.

In step 104, a netlist of an integrated circuit design is received as input. The netlist includes information as to what cells are to be placed and how they are connected to one another.

In step 106, a time driven cell placement is generated from the netlist that typically minimizes the total propagation delay.

In step 108, the clock tree for the integrated circuit design is synthesized. The clock tree synthesis generally minimizes the clock skew at each flip-flop in the circuit design.

In step 110, clock signal protection from crosstalk may be added by additional wire spacing or shielding around clock nets.

In step 112, a crosstalk and static timing analysis is performed to determine whether the circuit design meets all timing constraints, or achieves timing closure.

In step 114, if timing closure is not achieved, then further iterations of steps 102, 104 and 106 are performed until timing closure is achieved. Otherwise, control is transferred to step 116.

Step 116 is the exit point of the flow chart 100.

Disadvantageously, the design steps of FIG. 1 may have to be iterated many times for a successful design, and in some cases, it may not be possible to achieve timing closure by this method. Four of the most significant factors that affect clock skew and clock jitter in an integrated circuit design are:

(1) imperfect clock tree balance—an ideal clock tree should be balanced for all path delays to provide a non-zero clock skew, however, in practice, the clock skew is often non-zero;

(2) crosstalk—signal transitions in nets adjacent to clock nets dynamically and stochastically impact clock net delays, resulting in additional positive or negative crosstalk incremental delay and clock jitter in the clock nets;

(3) PVT variations—variations in the process, voltage, and temperature parameters and operating conditions including power dissipation, die temperature, transistor sizes, wire width, layer thickness, doping gradients, local hot spots, and voltage drops are generally unpredictable functions of spatial and temporal variables that affect clock skew dynamically and stochastically; and (4) chip functionality—previous clock synthesis tools ignore information regarding the timing criticality of paths between flip-flops. Failure to meet setup and hold time requirements frequently result in timing violations that will require correction later.

These four factors impact the clock signal arrival times at each flip-flop, and in timing critical paths, may result in decreased performance. The decreased performance becomes much more significant as the clock period is reduced in high performance design, and may result in multiple timing violations. Correcting the timing violations increases the time and cost of the design, possibly to the point of rendering the design impractical.

The previous method of cell placement and clock synthesis illustrated in FIG. 1 attempts to optimize only the total propagation delay of the integrated circuit design and the clock tree balance to minimize clock skew. The crosstalk, PVT variations, and chip functionality are ignored. Moreover, if cell placement is performed without anticipating the following step of clock tree synthesis, it may not be possible to synthesize a clock tree that satisfies the requirements of all four of the factors described above, as illustrated in the following example.

FIG. 2 illustrates a cell placement of two flip-flops connected by a logic cloud according to the prior art. Shown in FIG. 2 are flip-flops 202 and 204 and a logic cloud 206.

The logic cloud 206 represents a series of logic elements connected together to generate a logical function of the output of the flip-flop 202 at the input of the flip-flop 204. The logic elements may include, for example, AND gates, OR gates, and multiplexers that are connected according to well-known techniques to generate a desired logical function.

In step 102 of FIG. 1, cell placement is performed to minimize the path delay, because the maximum path delay defines the design performance with respect to the maximum possible clock rate. In other words, the cell placement of FIG. 1 is time driven. Assuming that the logic cloud 206 in FIG. 2 is the result of a time driven cell placement and that the timing constraints are met, a clock tree is generated according to step 106 of FIG. 1.

FIG. 3 illustrates a clock tree synthesized for the circuit diagram of FIG. 2. Shown in FIG. 3 are flip-flops 202 and 204, a logic cloud 206, a clock signal input 302, clock branches 304 and 306, and clock buffers 308.

Even though a time driven placement was used, the path length may still be large relative to the chip size. The two long clock branches 304 and 306 in the balanced clock tree of FIG. 3 are terminated at the flip-flops 202 and 204 at opposite ends of the logic cloud 206. The maximum path length between the flip-flops 202 and 204 is the result of the cell placement performed in step 102 of FIG. 1. The clock tree of FIG. 3 may be evaluated with respect to the four factors described above as follows.

(1) The clock tree of FIG. 3 will likely have a large value of clock skew, because the flip-flops 202 and 204 are located at a large path distance from each other, and because the clock branches 304 and 306 are routed across different paths across the die and may include different types of buffer cells. As a result, achieving a perfect balance in this clock tree may be difficult.

(2) The clock branches 304 and 306 include different nets that are adjacent to different aggressor nets, that is, nets that couple crosstalk into the clock branches 304 and 306. The injected crosstalk delay in the clock branches 304 and 306 may therefore be significantly different, and it is possible that the clock signal arrival time may be advanced in one clock branch and retarded in the other, increasing the clock skew and introducing a clock jitter.

(3) Because the clock branches 304 and 306 are routed across different areas of the die, the PVT (process, voltage, and temperature) conditions in the clock branches 304 and 306 will result in a greater difference in delay than if the ends of the branches had shared a single branch, further increasing clock skew.

(4) If the propagation delay through the logic cloud 206 is small, then the delay difference between the clock branches 304 and 306 should be minimal. If the propagation delay through the logic cloud 206 is large, then it may be advantageous to have more delay in the clock branch 306 than in the clock branch 302. Because the method of FIG. 1 does not recognize design functionality, no distinction is applied between the clock branches 304 and 306. Also, the fact that the clock branches 304 and 306 are routed across different areas of the die hinders precise tuning of the clock skew.

In summary, the cell placement and clock tree synthesis method of FIG. 1 typically results in a large value of clock skew and clock jitter at high clock rates. Applying more pessimistic values to the path delays makes timing closure more difficult and leads to more design iterations. If the effects of all four of the factors described above are not accounted for during timing closure, then the timing in the critical paths can fail in silicon, as the crosstalk effects and PVT variations become more significant in smaller technologies and more complex designs.

Finding an optimum clock tree may become even more complex in real designs, where multiple logic clouds may be connected in a chain by flip-flops.

FIG. 4 illustrates an example of multiple logic clouds connected by flip-flops according to the prior art. Shown in FIG. 4 are flip-flops 402, 404 and 406, and logic clouds 408 and 410.

In step 102 of FIG. 1, a time-driven cell placement is performed to minimize the path delay, because the maximum path delay defines the design performance with respect to the maximum possible clock rate. Assuming that the data logic clouds 408 and 410 in FIG. 4 are the result of a time driven cell placement and that the timing constraints are met, a clock tree is generated according to step 106 of FIG. 1.

FIG. 5 illustrates a clock tree synthesized for the circuit diagram of FIG. 4. Shown in FIG. 5 are flip-flops 402, 404 and 406, logic clouds 408 and 410, a clock signal input 502, clock branches 504, 506, and 508, and clock buffers 510.

The three long clock branches 504, 506, and 508 in the clock tree of FIG. 5 result in the same clock skew problems described above in the clock tree of FIG. 3.

In contrast to previous methods of cell placement and clock synthesis, a method of the present invention includes a partial clock synthesis in the cell placement stage of the integrated circuit design cycle. In one aspect of the present invention, a method of cell placement and clock tree synthesis includes steps of: (a) identifying critical paths in an integrated circuit design; (b) partitioning the integrated circuit design into a timing group for each of the critical paths; (c) assigning each flip-flop in a critical path to a timing group corresponding to the critical path; (d) performing a cell placement to minimize a function of propagation delay and maximum distance between flip-flops within each timing group; and (e) constructing a clock sub-net for each timing group.

To achieve timing closure in clocked integrated circuit designs, not every path represented by a logic cloud between flip-flops must be considered, rather only the critical paths. A path is critical to the setup time requirement if the propagation delay of the path is more than an empirical threshold, typically about 90 percent, of the clock period. A path is usually critical to setup time if the path includes a large number of cells, typically 40 to 70, and if the average wire length between cells is more than a small value, typically 200 microns. A path may also be critical to setup time if the path includes an average number of cells, typically 25 to 30, and if the average wire length between cells is more than a large value, typically 500 microns. A path is critical to hold time if the propagation delay of the path is less than an empirical threshold, typically about 10 percent, of the clock period. A path is usually critical to hold time if the path includes a small number of cells, typically 0 to 5, and the average wire length between cells is less than a small value, typically 200 microns.

If only critical paths are considered, then a circuit design may be partitioned into timing groups such that each critical path belongs to a timing group, each timing group contains only critical paths, and any critical path connected to another critical path belongs to the same timing group as the other critical path.

FIG. 6 illustrates a cell placement of two flip-flops connected by a logic cloud according to an embodiment of the present invention. Shown in FIG. 6 are flip-flops 602 and 604, and a logic cloud 606.

The cell placement of FIG. 6 differs from that of FIG. 2 in that the cell placement criteria include minimizing the distance between the flip-flops 602 and 604. The close proximity of the flip-flops 602 and 604 in the circuit design permit the insertion of a clock buffer that is close to both the flip-flops 602 and 604 as illustrated in FIG. 7.

FIG. 7 illustrates a partial clock tree for the cell placement of FIG. 6. Shown in FIG. 7 are flip-flops 602 and 604, a logic cloud 606, a clock sub-net buffer 702, and a clock sub-net 704.

The partial clock tree of FIG. 7 has two short connections from the clock sub-net buffer 702 to the flip-flops 602 and 604 that constitute the clock sub-net 704 due to the close proximity of the flip-flops 602 and 604. The partial clock tree of FIG. 7 may be used to construct an optimum clock tree according to the previous method illustrated in FIG. 3.

FIG. 8 illustrates a clock tree synthesis for the cell placement of FIGS. 6 and 7. Shown in FIG. 8 are flip-flops 602 and 604, a logic cloud 606, a clock sub-net buffer 702, a clock sub-net 704, a clock signal input 802, a clock branch 804, and clock buffers 806.

The clock tree synthesis illustrated in FIG. 8 is performed by constructing the partial clock tree with the cell placement of FIG. 7 and using the standard clock tree synthesis method of FIG. 3 to propagate the clock signal from the clock signal input 802 through the clock buffers 806 in the clock branch 804 to the clock sub-net buffer 702. The performance of the clock tree synthesis of FIG. 8 may then be compared to the four factors described above as follows:

(1) The clock tree in FIG. 8 has two parts: the clock branch 804 and the clock sub-net 704. The clock branch 804 may be excluded from consideration for all four factors, because the clock branch 804 is common to both clock paths from the clock signal input 802 to the flip-flops 602 and 604, which means that any crosstalk, injected crosstalk delay, or delay caused by process, voltage, and temperature (PVT) conditions will be the same at both the flip-flops 602 and 604. The remaining part of the clock tree in FIG. 8 is the clock sub-net 704.

(2) The clock sub-net 704 will probably have a very small clock skew because the flip-flops 602 and 604 are located close to each other. Although the routing is different to each of the flip-flops 602 and 604, the wire length and delay are nearly identical. Any crosstalk is coupled into the same clock sub-net 704 and has an identical impact on the clock arrival time at the flip-flops 602 and 604, so that the clock skew and jitter is not increased. The entire clock tree may have a non-zero clock skew, as is commonly the case, however the difference in clock skew will be between different timing groups, that is, between flip-flops that do not communicate with each other. Because the flip-flops in one timing group do not communicate with the flip-flops in another timing group, a large clock skew in the clock tree does not adversely affect the performance of the design.

(3) Because the clock sub-net 704 connects to the flip-flops 602 and 604 through the same area of the die and are driven by the same clock sub-net buffer 702, the process, voltage, and temperature conditions in each of the connections of the clock sub-net 704 to the flip-flops 602 and 604 will be substantially identical. As a result, the ends of the connections of the clock sub-net 704 to the flip-flops 602 and 604 will exhibit substantially identical delay differences over process, voltage, and temperature conditions and therefore will not increase clock skew.

(4) If the propagation delay through the logic cloud 606 is small, then the nearly zero difference in delay at the ends of the connections of the clock sub-net 704 to the flip-flops 602 and 604 is the best timing solution. On the other hand, if the propagation delay through the logic cloud 606 is large, then it may be useful to have a larger delay through the connection to the flip-flop 604 than the flip-flop 602 as illustrated in FIG. 9.

FIG. 9 illustrates a partial clock tree for the cell placement of FIG. 6 with inserted clock skew. Shown in FIG. 9 are flip-flops 602 and 604, a clock sub-net buffer 702, a logic cloud 902, and additional clock sub-net buffers 904.

The partial clock tree illustrated in FIG. 9 introduces a selected delay determined by the number and type of additional clock sub-net buffers 904 to accommodate a delay in the logic cloud 902 that is too large for a zero clock skew between the flip-flops 602 and 604.

Because an additional delay is desirable at the flip-flop 604 in this example, the requirement of placing the flip-flop 604 close to the flip-flip 602 may be relaxed, and the additional clock buffers 904 may be placed further from the flip-flip 602 and the flip-flop 604 as shown in FIG. 10.

FIG. 10 illustrates an alternative partial clock tree for the cell placement of FIG. 6 with inserted clock skew. Shown in FIG. 10 are flip-flops 602 and 604, a clock sub-net buffer 702, a clock sub-net 704, a logic cloud 902, and additional clock sub-net buffers 1002.

The partial clock tree illustrated in FIG. 10 introduces the same selected delay as the partial clock tree of FIG. 9, except that the flip-flops 602 and 604 are located further apart, and the inserted clock skew is determined by the number and type of additional clock sub-net buffers 1002 and the length of the clock subnet 704 between the clock sub-net buffer 702 and the flip-flop 604.

The clock-driven placement and clock synthesis method of the present invention described above is expressed as a series of steps as follows.

FIG. 11 illustrates a flow chart 1100 of a method of clock-driven placement and clock synthesis according to an embodiment of the present invention.

Step 1102 is the entry point of the flow chart 1100.

In step 1104, a netlist for an integrated circuit design is received as input. The netlist includes information as to what cells are to be placed and how they are connected to one another. In this example, the goal is zero clock skew and minimizing the effect of the four factors affecting clock skew described above.

In step 1106, a partition of the flip-flops into separate timing groups is initialized as empty, as no cell placement has been performed to generate information for critical paths.

In step 1108, a clock driven cell placement is generated from the netlist according to well-known techniques, except that the added function of minimizing the distance between flip-flops in each timing group is included in the cell placement criteria. The added function of minimizing the distance between flip-flops in each timing group may be generated according to well-known computer programming techniques.

In step 1110, a static timing analysis is performed according to well-known techniques. The static timing analysis identifies all the critical paths, including the first and last flip-flops in each critical path.

In step 1112, the flip-flops included in each critical path are assigned to a corresponding timing group. If any two critical paths are connected by the same flip-flop as in the example of FIG. 4, then all the flip-flops of the two paths are combined into the same timing group. As a result, each timing group contains only flip-flops that are included in a critical path, flip-flops in connected critical paths belong to the same timing group, and every flip-flop that is included in a critical path is assigned to a timing group. An option for adding useful clock skew is described below.

In step 1114, a quality factor is calculated that indicates how effectively the cell placement minimizes the four factors affecting clock skew described above. The quality factor may be, for example, a weighted sum of the maximum path delay and the maximum distance between two flip-flops in a timing group. For example, even if the maximum path delay is small, indicating good timing placement, but there is at least one timing group in which two flip-flops are separated by a large distance, then the quality factor may have a large value, indicating a poor timing placement.

In step 1116, if the quality factor is less than a selected threshold, or if there was no improvement in the quality factor from the previous iteration, then the cell placement for all timing groups is optimum, and control is transferred to step 1118. Otherwise, control is transferred back to step 1108 to improve the cell placement.

In step 1118, a partial clock tree is constructed for each timing group.

FIG. 12 illustrates an example of a clock-driven cell placement for a timing group according to an embodiment of the present invention. Shown in FIG. 12 are flip-flops 402, 404 and 406, and logic clouds 408 and 410.

As a result of the clock-driven placement of FIG. 12, the flip-flops 402, 404 and 406 are placed close together to minimize the four factors affecting clock skew described above. A clock buffer is inserted into each timing group as close as possible to every flip-flop in the timing group. The strength of the clock buffer is selected according to well-known techniques to drive the maximum distance between two flip-flops in the timing group. The clock buffer is preferably placed equidistant from the two flip-flops separated by the maximum distance in the timing group. The clock buffer is then connected to each flip-flop in the timing group to form a clock sub-net.

FIG. 13 illustrates a partial clock tree for the clock-driven cell placement of FIG. 12. Shown in FIG. 13 are flip-flops 402, 404 and 406, logic clouds 408 and 410, a clock sub-net buffer 1302, and a clock sub-net 1304.

As may be appreciated from FIG. 13, the clock skew has been minimized for each flip-flop in the timing group with respect to the four factors affecting clock skew described above. Preferably, a single clock buffer 1302 is used to construct the clock sub-net 1304. Clock skew is typically minimized more readily in a single buffer and connections than in multiple buffers and connections, because connections are less dependent on process, voltage, and temperature than buffer cells. Further, any injected crosstalk in the clock sub-net 1302 is substantially identical at each of the flip-flops 402, 404 and 406. An option for adding useful clock skew is described below.

In step 1120, the remainder of the clock tree is synthesized from the partial clock tree of FIG. 13 according to well-known techniques.

In step 1122, clock signal protection from crosstalk may optionally be added, for example, by additional wire spacing or shielding around clock nets as described above with respect to FIG. 1.

In step 1124, a crosstalk and static timing analysis is performed to determine whether the circuit design meets all timing constraints, that is, achieves timing closure.

In step 1126, if timing closure is not achieved, then the cell placement criteria may be modified, for example, to allow more freedom in placement of a flip-flop between a critical path and a non-critical path. Control is then transferred back to step 1108 until timing closure is achieved. Otherwise, control is transferred to step 1128.

Step 1128 is the exit point of the flow chart 1100.

Steps 1112 and 1118 of the flow chart of FIG. 11 may be modified as follows to provide even more robust capability for timing closure.

A timing violation in a critical path may be avoided by inserting a clock skew to compensate for a long path delay. Accordingly, step 1112 may be modified to replace a flip-flop between a critical path and a non-critical path with a flip-flop in the non-critical path in the assignment of flip-flops to a timing group as illustrated in FIG. 14.

FIG. 14 illustrates a timing group that includes a critical timing path connected to a non-critical timing path according to an embodiment of the present invention. Shown in FIG. 14 are flip-flops 1402, 1404, and 1406, a critical path 1408, and a non-critical path 1410.

In the example of FIG. 14, an additional delay may readily be implemented at the flip-flop 1404 to compensate for the delay in the critical path 1408, however, the large distance between the flip-flops 1402 and 1406 creates a difficulty in achieving a small delay from the clock buffer to the flip-flop 1406. By including the flip-flops 1402 and 1406 in the timing group without the flip-flop 1404, the cell placement of FIG. 15 is generated.

FIG. 15 illustrates an optimum clock driven cell placement for the timing group of FIG. 14. Shown in FIG. 15 are flip-flops 1402, 1404, and 1406, a critical path 1408, and a non-critical path 1410.

In FIG. 15, the flip-flops 1402 and 1406 are placed close together to minimize clock skew, while the flip-flop 1404 is placed to minimize the total propagation delay in the timing group.

In step 1118, a clock buffer is inserted between the flip-flops 1402 and 1406 to construct the partial clock tree illustrated in FIG. 16.

FIG. 16 illustrates a partial clock tree for the clock driven cell placement of FIG. 15. Shown in FIG. 16 are flip-flops 1402, 1404, and 1406, a critical path 1408, a non-critical path 1410, a clock sub-net buffer 1602, and a clock sub-net 1606.

In FIG. 16, the clock sub-net buffer 1602 is placed equidistant from the flip-flops 1402 and 1406 in the clock sub-net 1606 to minimize clock skew.

Step 1118 is modified to include additional clock buffers if needed to complement the greater distance to the flip-flop 1406 to generate the desired clock skew. The resulting partial clock tree from the modified step 1118 is illustrated in FIG. 17.

FIG. 17 illustrates the addition of a useful clock skew to the partial clock tree of FIG. 16. Shown in FIG. 17 are flip-flops 1402, 1404, and 1406, a critical path 1408, a non-critical path 1410, a clock sub-net buffer 1602, a clock sub-net 1606, and delay buffers 1702.

In FIG. 17, the delay buffers 1702 are inserted between the clock sub-net buffer 1602 and the flip-flop 1406 to provide the clock skew needed to meet the timing constraints of the critical path 1408. The shortened clock period between the flip-flops 1404 and 1406 is then applied to the non-critical path 1410 to maintain substantially zero clock skew at the flip-flops 1402 and 1406.

The modifications to steps 1112 and 1118 described above can provide useful clock skew when needed to achieve timing closure in otherwise difficult designs while minimizing the number of cell placement and timing analysis iterations required. Also, the four factors affecting clock skew described above are minimized so that design performance is improved without applying more pessimistic delays on data paths.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The steps described above with regard to the flow chart 1100 may also be implemented by instructions performed on a computer according to well-known programming techniques.

In another aspect of the present invention, a computer program product for cell placement and clock tree synthesis includes:

a medium for embodying a computer program for input to a computer; and a computer program embodied in the medium for causing the computer to perform steps of:

(a) identifying critical paths in an integrated circuit design;

(b) partitioning the integrated circuit design into a timing group for each of the critical paths;

(c) assigning each flip-flop in a critical path to a timing group corresponding to the critical path;

(d) performing a cell placement to minimize a function of propagation delay and maximum distance between flip-flops within each timing group; and (e) constructing a clock sub-net for each timing group.

While the invention herein disclosed has been described by means of specific embodiments and applications thereof, numerous modifications and variations could be made thereto by those skilled in the art without departing from the scope of the invention set forth in the following claims.

What is claimed is:

1. A method of cell placement and clock tree synthesis comprising steps of:

(a) identifying critical paths in an integrated circuit design;

(b) partitioning the integrated circuit design into a timing group for each of the critical paths wherein each timing group includes only critical paths;

(c) assigning each flip-flop in a critical path to a timing group corresponding to the critical path;

(d) performing a cell placement to minimize a function of propagation delay and maximum distance between flip-flops within each timing group; and (e) constructing a clock sub-net for each timing group.

2. The method of claim 1 wherein each timing group contains only flip-flops that are included in a critical path.

3. The method of claim 1 further comprising a step of replacing a flip-flop in a critical path with a flip-flop in a non-critical path connected to the critical path.

4. The method of claim 3 further comprising a step of inserting a clock skew between the critical path and the non-critical path.

5. The method of claim 1 wherein flip-flops in connected critical paths are assigned to the same timing group.

6. The method of claim 1 wherein every flip-flop that is included in a critical path is assigned to a timing group.

7. The method of claim 1 further comprising a step of coupling a clock buffer to the clock sub-net so that the clock buffer is equidistant from each flip-flop in the timing group.

8. The method of claim 1 further comprising a step of coupling a clock signal to the clock buffer from a clock tree.

9. The method of claim 7 wherein the clock tree is a balanced clock tree.

10. A computer program product for cell placement and clock tree synthesis comprising:
   a medium for embodying a computer program for input to a computer; and
   a computer program embodied in the medium for causing the computer to perform steps of:
   (a) identifying critical paths in an integrated circuit design;
   (b) partitioning the integrated circuit design into a timing group for each of the critical paths;
   (c) assigning each flip-flop in a critical path to a timing group corresponding to the critical path wherein each timing group includes only critical paths;
   (d) performing a cell placement to minimize a function of propagation delay and maximum distance between flip-flops within each timing group; and
   (e) constructing a clock sub-net for each timing group.

11. The computer program product of claim 10 wherein each timing group contains only flip-flops that are included in a critical path.

12. The computer program product of claim 10 further comprising a step of replacing a flip-flop in a critical path with a flip-flop in a non-critical path connected to the critical path.

13. The computer program product of claim 12 further comprising a step of inserting a clock skew between the critical path and the non-critical path.

14. The computer program product of claim 10 wherein flip-flops in connected critical paths are assigned to the same timing group.

15. The computer program product of claim 10 wherein every flip-flop that is included in a critical path is assigned to a timing group.

16. The computer program product of claim 10 further comprising a step of coupling a clock buffer to the clock sub-net so that the clock buffer is equidistant from each flip-flop in the timing group.

17. The computer program product of claim 16 further comprising a step of coupling a clock signal to the clock buffer from a clock tree.

18. The computer program product of claim 17 wherein the clock tree is a balanced clock tree.

* * * * *